United States Patent
Stauber et al.

(10) Patent No.: US 6,362,622 B1
(45) Date of Patent: Mar. 26, 2002

(54) METHOD AND APPARATUS TO EMBED AND RETRIEVE ATTRIBUTE INFORMATION IN MAGNETIC RESONANCE IMAGING COILS

(75) Inventors: John R. Stauber, Fairview Park; Michael Burl, Chagrin Falls, both of OH (US)

(73) Assignee: Philips Medical Systems, (Cleveland) Inc., Highland Heights, OH (US)

(*) Notice: Subject to any disclaimer, the term of this patent is extended or adjusted under 35 U.S.C. 154(b) by 0 days.

(21) Appl. No.: 09/516,002

(22) Filed: Feb. 29, 2000

(51) Int. Cl.[7] .................................................. G01V 3/00
(52) U.S. Cl. ...................................... 324/318; 324/322
(58) Field of Search ................................ 324/318, 322, 324/300, 314, 307, 309; 600/410, 421, 423; 340/652, 572

(56) References Cited

U.S. PATENT DOCUMENTS

| | | | |
|---|---|---|---|
| 4,972,852 A | 11/1990 | Koob et al. ............. 128/653 R |
| 5,065,760 A | 11/1991 | Krause et al. ............ 128/653.5 |
| 5,461,314 A | 10/1995 | Arakawa et al. ............ 324/318 |
| 5,657,761 A | * 8/1997 | Okada et al. .......... 128/660.01 |
| 5,689,242 A | * 11/1997 | Sims et al. ................ 340/652 |
| RE36,495 E | 1/2000 | Blakeley et al. ............ 600/410 |

OTHER PUBLICATIONS

Dallas Semiconductor, DS2433 4K–BIT 1–Wire™, EEPROM, Dec. 1999, pp. 1–18.

* cited by examiner

Primary Examiner—Louis Arana
(74) Attorney, Agent, or Firm—Fay, Sharpe, Fagan, Minnich & McKee, LLP

(57) ABSTRACT

A magnetic resonance imaging system includes a patient couch (10) which selectively positions a patient relative to an examination region (14). An imaging coil (B) is disposed adjacent to a region of interest for receiving magnetic resonance signals emanating from the patient. A processor (48) both controls the imaging event and processes received signals from the imaging coil. A plug and socket assembly (24, 26) having a proximal component and a distal component relative to the imaging coil provides selective electrical connectivity between the imaging coil (B) and the processor (48). A non-volatile memory device (86), such as a 1-WIRE™ EEPROM, is affixed to the proximal component of the plug and socket assembly (24, 26) for storing a variety attributes associated with the imaging coil. The memory device is most conveniently mounted to a coaxial connector (110).

17 Claims, 4 Drawing Sheets

METHOD AND APPARATUS TO EMBED AND RETRIEVE ATTRIBUTE INFORMATION IN MAGNETIC RESONANCE IMAGING COILS

BACKGROUND OF THE INVENTION

The present invention relates to a radio frequency coil front end interface system for magnetic resonance scanners. The invention finds particular application in conjunction with an intelligent detection and recognition system for identifying and retrieving data associated with a radio frequency imaging coil. The invention will also find application in conjunction with spectroscopy, cable connection and interface systems for radio frequency coils and the like.

Horizontal or bore-type magnetic resonance imagers commonly include a bore dimensioned to receive a patient to be imaged. The bore is surrounded by a magnet assembly for generating a temporally constant magnetic field axially through the bore. Whole body radio frequency and gradient coils typically surround the bore. A patient couch supports and transports the patient into and out of the bore. More specifically, the patient couch is commonly height adjustable. The patient support surface is retractable from the bore for positioning the patient therein and extendable into the bore.

Analogously, in vertical field or open magnetic resonance imagers, pole pieces are typically positioned above and below the patient. Magnetic coils are associated with the poles to create a temporally constant field vertically between them. Gradient field and radio frequency coils are typically mounted to the pole structures.

When doing localized scans such as head or heart scans, a distinct localized coil is commonly positioned closely adjacent the patient. Cables, typically coaxial cables, are connected between the coil and a radio frequency receiver and/or transmitter.

One known technique to determine what type of coil is in a machine discloses a coil (specifically, a head coil) with an 8-pin connector. A selected one or a selected pattern of the pins are connected to ground to provide an 8bit binary identification of the insertable coil. A digital circuit reads which pins are and are not shorted to ground as 1's and 0's and uses digital logic to indicate to the computer the type of coil installed.

One disadvantage of this system is that it is very complex to manage a multiple conductor cable because it is large and prone to pick up stray radio frequency signals. Moreover, if one of the wires or contacts fails, an incorrect indication of the type of the installed coil is provided to the computer. This erroneous indication of the installed coil could cause an imaging sequence to be initiated which could injure the patient or cause damage to the magnetic resonance equipment.

Another disadvantage of this type of a system is the limited amount of data located on the coil, specifically 8 bits. To determine all of the potentially needed attributes of a coil, for example, model number, number of operating modes including details for each, particular decoupling voltages and the like, resort is typically made to a look-up-table accessible to the processor. In other words, the data for the coil is not resident on the coil itself, making upgrades and changes difficult.

Another known technique to determine which one of a plurality of coils is in a MR machine uses a resistive element at a plug or interface between the RF coil and the processor. Accordingly, when the coil side plug is inserted into the MR system receptacle, the processor can determine the resistance, and then determine the inserted coil based on a known relationship between resistance and coil type. Undesirably, this technique can only distinguish a relatively small number of discrete coil types. Further, once the resistive value is determined the processor must still resort to a lookup table, typically resident on the system side of the MR machine, to ascertain operating modes and characteristics.

Yet another technique to distinguish between a variety of coils potentially usable in a machine involves a microprocessor system buried within the coil side of the system. The microprocessor based solution also suffers from several undesirable aspects such as: 1) An additional line required for providing power to the processor; 2) Additional support components, like voltage regulators, decoupling and/or filtering capacitors, etc., and a printed wiring board on which to mount them; 3) The inherently ferrous nature of the packaging materials of processors, which can lead to localized distortion of the main magnetic field; and 4) All the inherent problems associated with suppressing and/or eliminating the EMI noise generated by the local oscillator which provides the main "clock" for the processor.

The present invention contemplates an improved attribute storage system which overcomes the above-referenced problems and others.

SUMMARY OF THE INVENTION

In accordance with one embodiment of the present invention, a magnetic resonance imaging apparatus includes an imaging coil selectively connectable to a processor through a plug and socket assembly. The plug and socket assembly has a proximal component on the coil side of the assembly, and a distal component on the processor side of the assembly. A memory device is affixed to the proximal component of the plug and socket assembly for storing data attributes particular to the image coil.

In accordance with another aspect of the present invention, the proximal component includes a substantially non-conductive housing having a plurality of channels defined therethrough. At least one connector is disposed within selected ones of the channels and a corresponding number of data leads, electrical or optical, are affixed to the connectors. An electrical or optical conductor is disposed within a remaining channel and is in communication with the memory device.

In accordance with another aspect of the present invention, the distal component includes a substantially non-conductive housing adapted to engage with the housing of the proximal component. Matching connectors are disposed within channels in the housing adapted to cooperate with the connectors in the proximal component to provide a selective signal path between the proximal and the distal components. An electrical or optical lead is in communication with the data pin on the memory device when the proximal and distal components are engaged.

In accordance with another aspect of the present invention, the memory device includes a programmable read only memory internally configured to store a coil name.

In accordance with another aspect of the present invention, the a programmable read only memory includes exactly one data pin and exactly one ground pin.

In accordance with another aspect of the present invention, the data attributes associated with the imaging coil include coil bias patterns for selected modes of coil operation.

In accordance with another embodiment of the present invention, a method of manufacturing a magnetic resonance imaging coil includes connecting a memory device capable of storing a plurality of data attributes to the magnetic resonance imaging coil. The method further includes storing data attributes associated with the magnetic resonance imaging coil in the memory device.

In accordance with another aspect of the present invention, the coil mechanically connects to a magnetic resonance imaging system via a coil-side mating element connectable to an MR-side mating element. The method further includes disposing the memory device in the coil-side mating element.

In accordance with another aspect of the present invention, the disposing step includes electrically connecting a ground pin from the memory device to a conductive connector disposed in the coil side mating element. A path to ground is selectively established via an associated connector in the MR-side mating element.

In accordance with another aspect of the present invention, the disposing step further includes positioning a data pin from the memory element within the connector. A data path is then selectively established via an associated data lead in the MR-side mating element.

In accordance with another aspect of the present invention, the method further includes loading a coil name into a determined location in the memory device.

In accordance with another aspect of the present invention, representative currents and voltages for different channels supported by the coil are loaded into determined locations within the memory device.

In accordance with another embodiment of the present invention, a magnetic resonance imaging coil for selective operable connection to a magnetic resonance scanner includes a radio frequency antenna for at least receiving RF signals. A memory device stores data attributes associated with the radio frequency antenna.

In accordance with another aspect of the present invention, a coil-side mating element in communication with the radio frequency windings provides selective mechanical and data association with a corresponding mating element.

In accordance with another aspect of the present invention, the memory device includes an EEPROM.

In accordance with another aspect of the present invention, the EEPROM is disposed on the coil-side mating element.

In accordance with another aspect of the present invention, the EEPROM includes exactly one data pin and exactly one ground pin.

In accordance with another aspect of the present invention, the stored data attributes include a coil name.

In accordance with another aspect of the present invention, the stored data attributes include representative currents and voltages for channels associated with the magnetic resonance imaging coil.

In accordance with another aspect of the present invention, the stored data attributes include representative modes, associated bias patterns, and valid receive signal patterns associated with the magnetic resonance imaging coil.

One advantage of the present invention resides in the relatively large number of ID codes possible.

Another advantage of the present invention resides in the coil-side storage of coil attribute information.

Yet another advantage resides in the ability to introduce new coils and/or new functionality without having to update MR-side software.

Still further advantages of the present invention will become apparent to those of ordinary skill in the art upon reading and understanding the following detailed description of the preferred embodiments.

BRIEF DESCRIPTION OF THE DRAWINGS

The invention may take physical form in certain parts and arrangements of parts, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
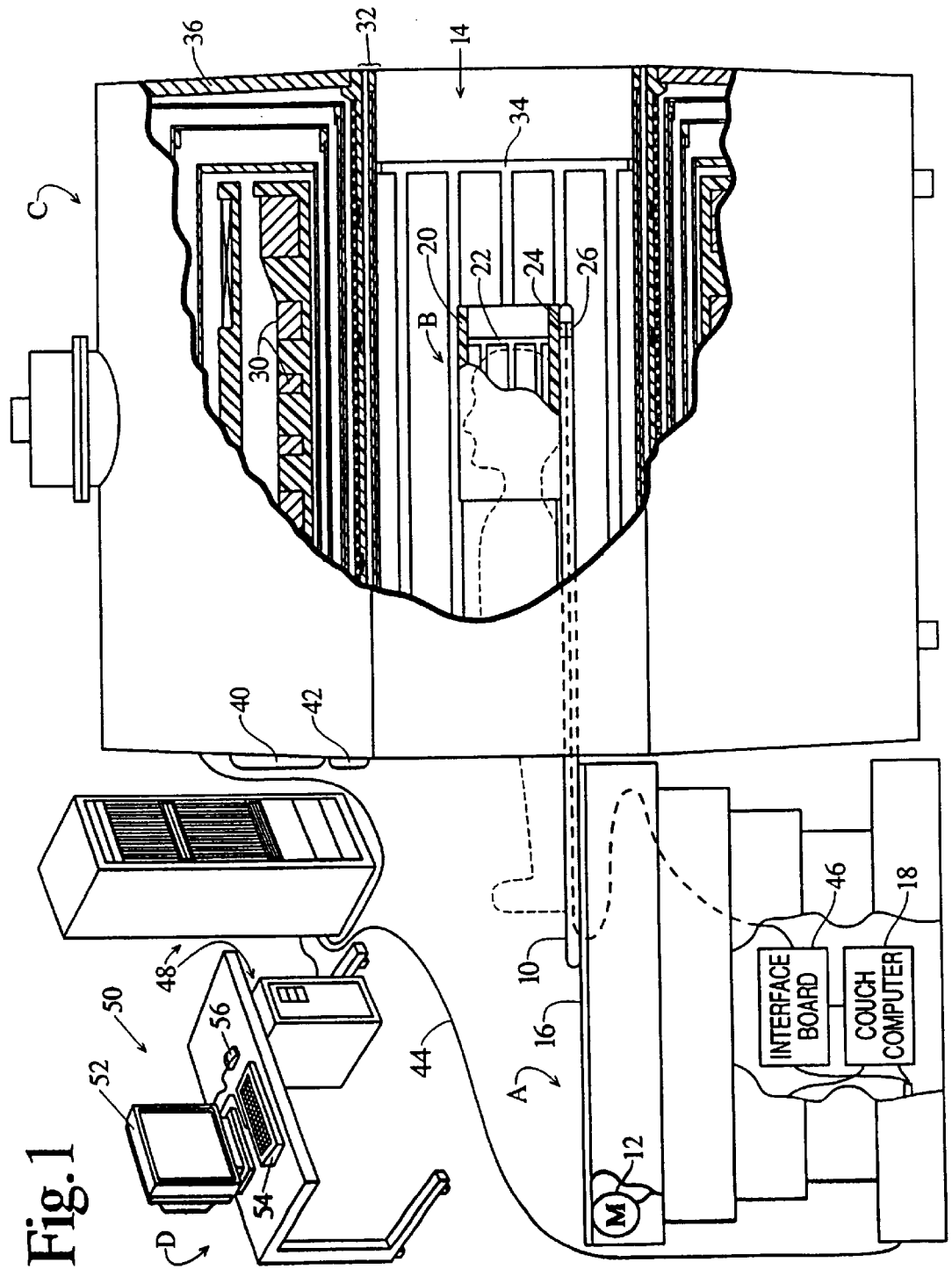
FIG. 1 is a diagrammatic illustration of a magnetic resonance imaging system in accordance with the present invention.

With reference to FIG. 1, a patient couch assembly A selectively inserts and retracts a patient and a localized coil assembly B into and out of an examination region of a magnet unit C. The patient couch A includes a patient supporting surface 10 which is drivable by a drive motor 12 or manually movable into and out of a bore 14 of the magnet unit. The patient supporting portion 10 is slidably mounted on rails 16 which are connected with a scissor unit or other mechanical system for selectively raising and lowering the patient supporting surface 10. When a nonpermanent coil is needed, the patient supporting portion 10 is fully withdrawn from the bore or advanced fully through the bore to mount a selected one of a plurality of insertable localized coils thereon. Thereafter, the patient is positioned and the patient supporting surface is advanced into the bore.

Each localized coil B includes a dielectric former 20 on which a radio frequency coil 22 is supported. A plug 24 is connected with the localized coil for receipt in a socket 26 disposed in the patient supporting surface 10. With certain coils, the plug 24 is affixed to one end of a coaxial cable bundle with the other end electrically connected to the coil.

The magnet unit C includes magnets 30 for generating a temporally constant magnetic field along a central or z-axis of the bore 12. A whole body gradient coil assembly 32 and a whole body RF coil 34 are mounted around the bore 14. A radio frequency shield separates the whole body gradient and RF coils. Of course, open or vertical field magnets are also contemplated.

An operator display panel 40 is mounted to the magnet assembly for providing a display to the operator concerning the position of the patient supporting portion 10, the type of RF coil, the location of the RF coil, any errors or defects in the RF coil, and the like. An operator control panel 42 receives operator commands which are communicated to the couch computer 18 for controlling position of the couch top 10, and the like. Under the control of a couch mounted computer 18, the drive motor 12 selectively advances the patient supporting surface into the bore until an isocenter of the localized coil is at an isocenter of the magnet unit C.

A cable 44, preferably a fiber optic cable, provides data communication between the couch computer 18 and an interface board 46 disposed within the magnet room and an operator control station D located outside the magnet room in an operator control facility including a front end interface, control and reconstruction computer assembly 48. An operator interface and control station 50 includes a human-readable display such as a CRT or flat screen monitor 52 and operator input means including a keyboard 54 and a mouse 56.

Figure 2:
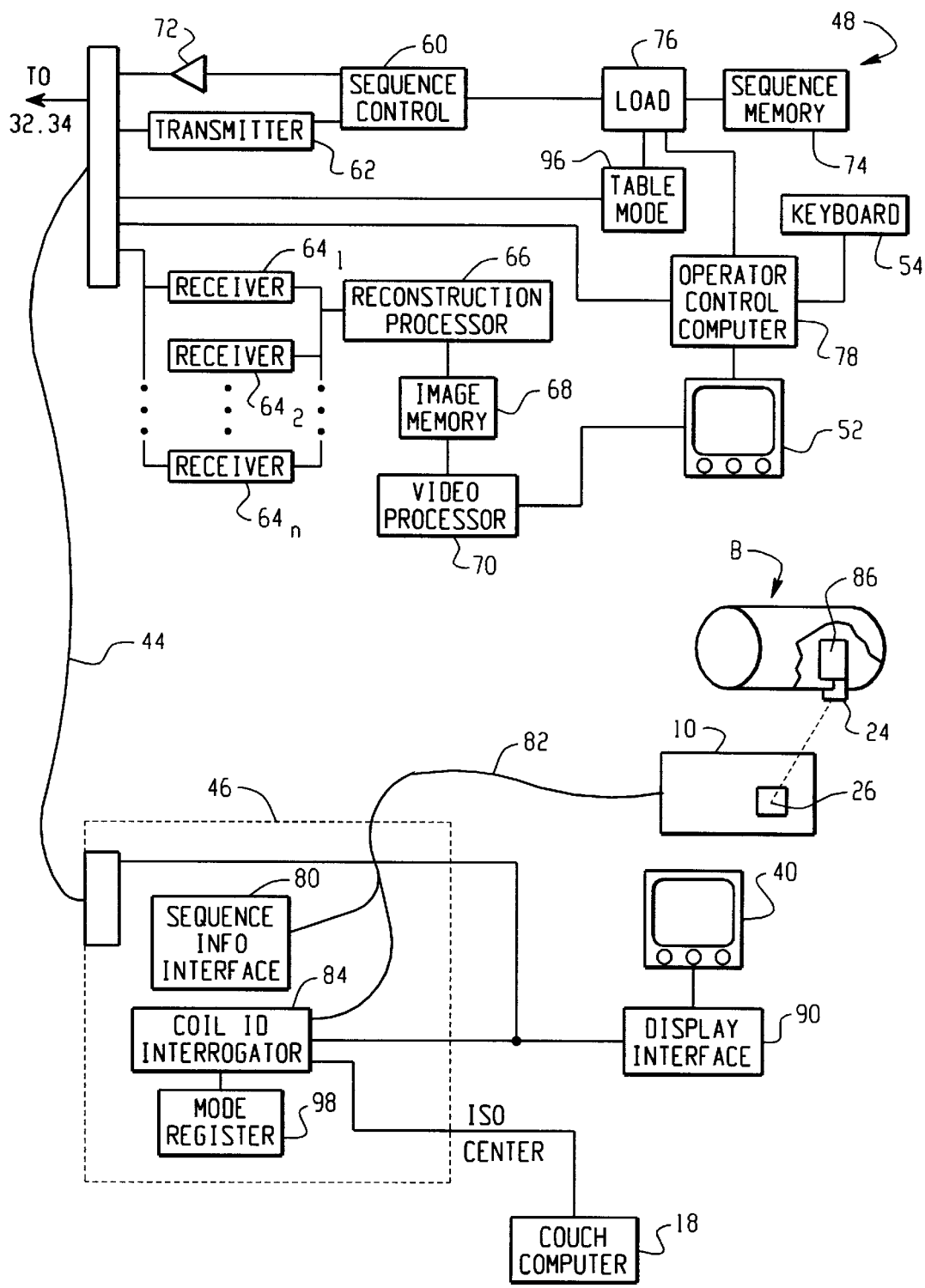
FIG. 2 is a more detailed diagrammatic illustration including details of the front end interface and related hardware in accordance with the present invention.

With particular reference to FIG. 2, the interface, control, and reconstruction computer assembly 48 includes a magnetic resonance sequence controller 60 for controlling magnetic resonance sequences that are applied to the gradient and radio frequency coils. A digital transmitter 62 transmits radio frequency signals under the control of the sequence controller to the radio frequency coils. A plurality of digital receivers $64_1$, $64_2$, . . . , $64_n$ demodulate the received resonance signals from each of n channels and conveys them to a reconstruction processor 66 which reconstructs the magnetic resonance signals into an image representation which is stored in an image memory 68. A video processor 70 selectively extracts portions of the stored reconstructed image representation and formats the data for display on the video monitor 52. The sequence controller 60 also controls gradient amplifiers 72 which control current to the gradient coils 32 (FIG. 1) to create the gradient field profiles of the selected magnetic resonance sequence. A sequence memory 74 stores detailed instructions for performing each of the numerous magnetic resonance sequences which the system is programmed to perform. A sequence loading means 76 is controlled by the keyboard or mouse and an operator control computer 78 to load the detailed instructions for a selected sequence into the sequence controller 60 to be performed.

The cable 44 conveys the operator instructions and sequence instructions to the couch computer 18 and the interface board 46. The interface board 46 includes a sequence information interface 80 which conveys the RF coil bias switching pulses to a flexible cable 82 which extends through the patient couch assembly to the socket 26. The localized coil B has appropriate internal connections to connect its associated plug with its radio frequency coils. The plug and socket also connect a coil identification and attribute interrogation unit 84 with an electronic coil attribute storage component 86. Preferably, the storage component 86 is a two lead EEPROM such as is commercially available from Dallas Semiconductor under the trade name 1-WIRE™.

The coil interrogation unit 84 in the preferred embodiment periodically polls address space allotted to the EEPROM 86. When a coil is found, as determined by the presence of data populating the address queried by the interrogation unit 84, the attribute information stored on the EEPROM 86 (more fully discussed below) is retrieved and displayed, through display interface 90, to the operator display panel 40.

The coil interrogator 84 also conveys the coil attribute information on the cable 44 to an acceptable mode storage table 96. Optionally, the acceptable mode storage table 96 may be eliminated with mode data accessed when needed directly from the memory device 86. The acceptable mode storage table 96 interacts with the sequence loading means 76 such that only sequences which are supported by the identified coil are loaded into the sequence controller 60. The acceptable mode table 96 acts as an interlock to lock out all but a selected list of modes, which may be accessed by the loading means 76 to determine which sequences are acceptable to be loaded, or the like.

The localized radio frequency coil B may be any type of receive, transmit, or transmit and receive coil of any geometry or configuration. It may contain multiple RF coils which operate in a simultaneously or switched array topology. The RF cable 82, may be a single coaxial cable of any diameter, multiple cables or fiber optic cables as may be appropriate to the insertable coil.

The operating modes can be set either by the couch computer 18 or the system computer 78 via the bus 44. The bus is preferably a serial data and clock bus which daisy chains through several parts of the MR system. Preferably the bus is a multi-master bus with a defined protocol to permit different masters to have control of the bus. The couch and system computers can each act as masters and all of the devices act as slaves to the bus.

After a valid coil is detected and identified, the interface operating mode is selected by writing the selected mode into the mode register 98 on the interface 46. The mode is read back from the register 98 to the system computer 78 to verify that the proper test procedures have been selected. The coil is tested by turning the test bit on and off in the register. The test mode validates the channels of the coil which are plugged into the couch as well as the whole body coil and the radio frequency signal transmit/receive switch in the sequence information interface 80. The results of the coil test are also stored in the mode register 98 to be read by the system computer. If an invalid status or error is determined by the test unit, the display interface 90 displays the appropriate error message on the couch display 40.

The front end interface 48 provides the primary link to the bus 44. The front end interface provides communication to the couch computer to turn it off during a scan, to command horizontal and vertical motion of the couch, and to determine the current position of the couch. The couch position is used to set up array coils, and the like. Communication with the couch mounted interface 46 determines which coil is installed on the couch and causes the testing to be performed on the coil.

Some functions are preferably duplicated between the couch computer 18 and the front end interface 48, for example, detection of the coil attribute storage data. The main system computer initiates several tasks through the front end interface prior to initiation of a scan. For example, the scan computer accesses the EEPROM 86 directly over the bus 44 and notifies the operator of the coil or lack thereof. After a valid coil is detected, the primary system computer selects and tests the interface operating mode by writing the mode associated with that coil into the mode register 98. The mode is read back from the mode register to verify that the test mode has been properly set. The coil is tested as before by turning the test bit on and off in the register 98. The test mode validates all channels of the coil which are plugged into the couch, as well as the body coil and the power transmit/receive switch in the sequence information interface 80. The results of the coil test are read into the system computer. If there is an error or invalid coil status, the appropriate error message is displayed. The default operating mode is selected by writing the mode associated with the coil into the mode register 98 and reading back the mode from register 98 to verify that the operating mode has been properly selected.

The interface board 46 is interlocked with an RF enable signal to a power signal in the sequence interface 80. During the transmit period, the interface board 46 checks to make sure that the bias current is flowing at the correct levels in the body coil, the high power radio frequency transmit/receive switch, and any coils plugged into the couch connector 26. During the receive enable period, the body coil and the high power transmit/receive switch are checked in a similar manner. The diagnostic interface provides the primary link to the bus 44 during system power-up/down sequences and during the system diagnostics. The diagnostic interface further provides communication to the couch computer 18 to initiate diagnostic functions. Communication with the interface 46 determines which coil is installed on the couch and performs tests of the coil during diagnostic functions. Communication with the radio frequency amplifier determines whether it is operating properly and performs any functional diagnostic tests of its internal sub-systems. Communications with the system computer initiate diagnostic functions. Communications with the gradient amplifier also initiate diagnostic functions.

Figure 3:
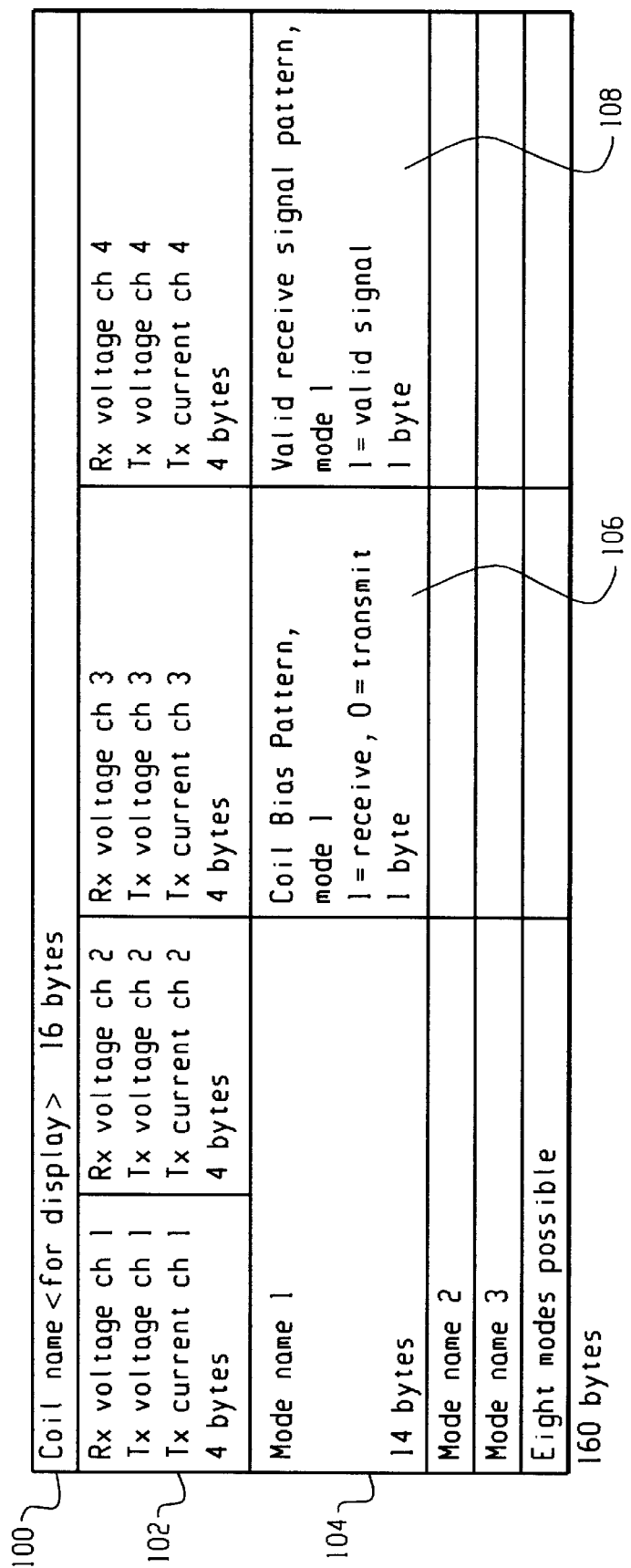
FIG. 3 is an exemplary illustration of a data arrangement within the memory device suitable to the present invention.

With reference to FIG. 3 the electronic coil attribute storage component 86 is preferably an EEPROM of the type commercially available from, for example, Dallas Semiconductor under the trade name 1-WIRE™. The EEPROM 86 is organized such that a first field 100 of 16 bytes is allotted for the coil name. A second field 102 is organized to contain receive and transmit voltage data in addition to transmit current information for each of four separate channels. The remaining fields are organized by mode name, e.g. 104; with associated bias patterns, e.g. 106; and associated valid receive signal patterns, e.g. 108. The voltage and current information and other coil attributes can also be used to customize settings in the sequence control 60 and the sequence interface 80 for the individual coil in place.

Figure 4:
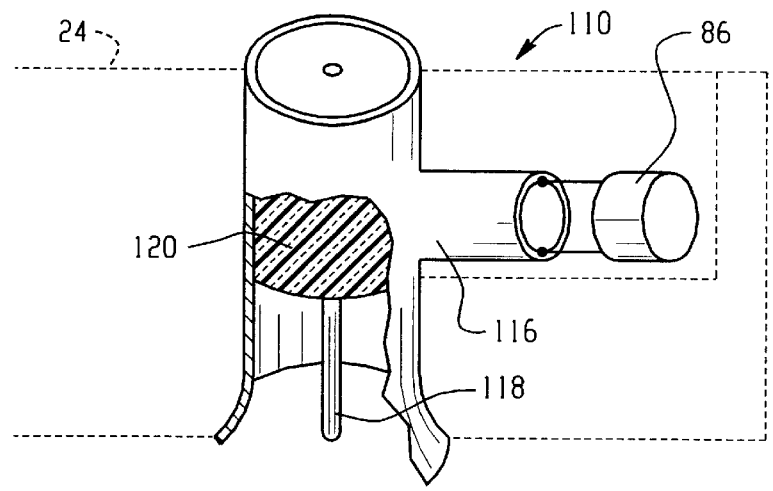
FIG. 4 is an exemplary illustration of a coaxial connector and memory device within a plug.

With reference now to FIG. 4, the plug 24 is preferably formed from a non-conductive material shaped to receive at least one electrically conductive coaxial connection element 110. The 1-WIRE™ EEPROM 86 includes a ground pin 112, and an active pin 114 on which power and data are conveyed to and from the memory device. The 1-WIRE™ EEPROM has a third physical pin which has no electrical function.

Figure 5:
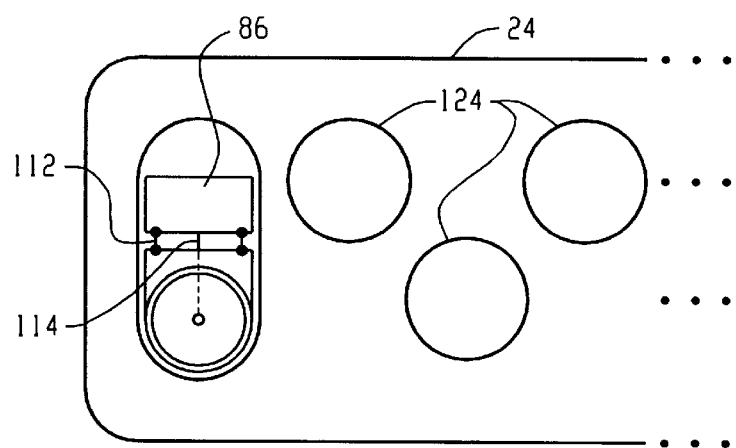
FIG. 5 is another view of the plug of FIG. 4.
Figure 6:
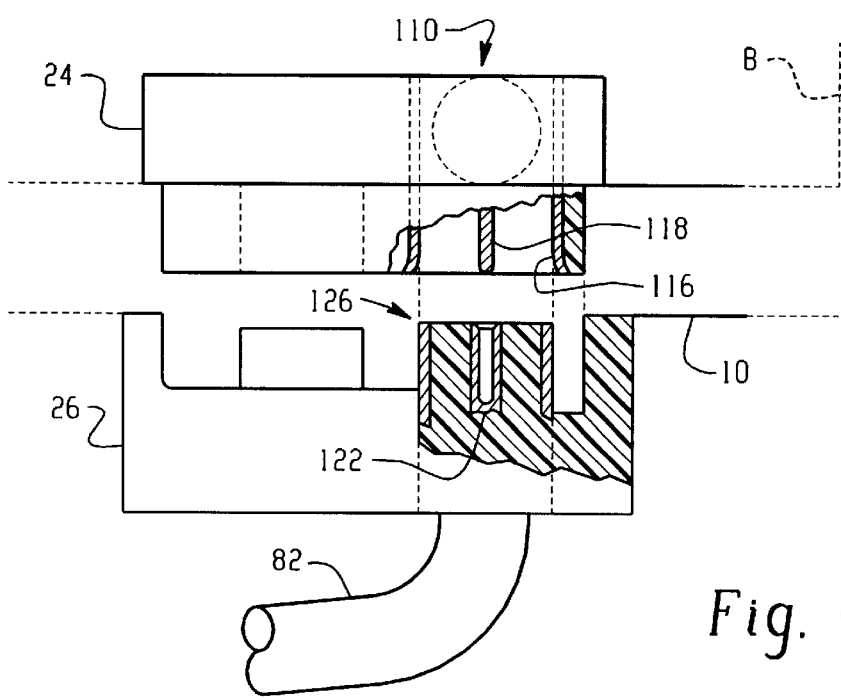
FIG. 6 is an illustration of an exemplary plug and socket assembly suitable for the present invention.

Cross referencing now FIG. 4, 5, and 6 pin 112 is in electrical communication with the outer, ground or shield element 116 of connection element 110. Additionally, the pin 114 is in electrical communication with a central conductor 118 of the connector 110. A dielectric 120 holds the central connector 118 in place to interconnect with corresponding portions of the socket 26. The pin 114 is disposed such that it makes electrical contact with a corresponding central electrical contact 122 within the socket 26. Further reference to FIG. 5 illustrates that the plug 24 contains other connection elements 124 suitable to make additional connections between the coil B and the socket 26, hence the processing equipment located on the MR device itself. Those skilled in the art will appreciate that the other connection elements 124 can be used to connect magnetic resonance signals from the coil B to the processing equipment, biasing voltages from the MR machine to the coil, optical data and the like.

Referring in particular to FIG. 6, the plug 24 is adapted to be telescopically received by the socket 26. To improve clarity, only one of the coaxial connections 110 is shown although others are desirable as discussed above. As the plug 24 is urged into the socket 26, preferably embedded within the patient support 10, a mating electrical connector 126 is aligned with and telescopically engages the coaxial connector 110. The outer shield elements firmly frictionally engage to provide a secure ground or shield connection. One of the center elements is frictionally received telescopically in the other to provide a secure center conductor connection.

When the plug 24 is in place within the socket 26, those skilled in the art will appreciate that electrical communication is established between the center conductor of cable 82 and the data pin 114 of the 1-WIRE™ EEPROM. Those skilled in the art will appreciate that the plug/socket assembly illustrated ensures both electrical and mechanical engagement by friction between the plug and socket. Moreover, while the plug 24 need only support the number of coaxial connections needed by any particular individual coil, the socket 26 is configured so as to receive the plug having the maximum number of connections.

The invention has been described with reference to the preferred embodiments. Modifications and alterations will naturally occur to others upon reading and understanding the preceding detailed description. It is intended that the invention be construed as including all such modifications and alterations insofar as they come within the scope of the appended claims, or the equivalents thereof.

Having thus described the preferred embodiment, the invention is now claimed to be:

1. A magnetic resonance imaging apparatus comprising:
   a patient couch which selectively positions a patient relative to an examination region;
   an imaging coil disposed adjacent a region of interest which at least receives magnetic resonance signals emanating from the patient;
   a processor which controls an imaging event and processes received magnetic resonance signals from the imaging coil into an image representation;
   a plug and socket assembly having a proximal component and a distal component relative to the imaging coil, the plug and socket assembly selectively connecting the imaging coil and the processor; and
   a memory device affixed to the proximal component of the plug and socket assembly which stores a plurality of attributes associated with the imaging coil.

2. The magnetic resonance imaging apparatus as set forth in claim 1, wherein the proximal component comprises:
   a substantially non-conductive housing having a plurality of channels defined within;
   at least one connector disposed within selected ones of the plurality of channels;
   a selected number of data leads, each affixed at one end to one of the connectors, and affixed at an opposite end to the imaging coil; and,
   an electrically conductive connector disposed within an additional one of the plurality of channels, wherein the additional connector is in electrical communication with the memory device.

3. The magnetic resonance imaging apparatus as set forth in claim 2, wherein the distal component comprises:
   a substantially non-conductive housing adapted to engage with the housing of the proximal component;
   mating connectors disposed within channels in the housing, the connectors adapted to cooperate with the connectors of the proximal component providing a selective data path between the proximal component and the distal component; and, an electrical lead in electrical communication with a data pin on the memory device when the proximal and distal components are engaged.

4. The magnetic resonance imaging apparatus as set forth in claim 1, wherein the memory device comprises a programmable read only memory internally configured to store a coil name.

5. The magnetic resonance imaging apparatus as set forth in claim 4, wherein the programmable read only memory comprises exactly one data and power pin and a ground pin.

6. The magnetic resonance imaging apparatus as set forth in claim 1, wherein the data attributes associated with the imaging coil comprise coil bias patterns for selected modes of coil operation.

7. The magnetic resonance imaging apparatus as set forth in claim 1, wherein plug and socket assembly includes a plurality of co-axial connectors, the memory device being connected with one of the coaxial connectors.

8. A method of manufacturing a magnetic resonance imaging coil comprising:

connecting a memory device capable of storing a plurality of coil attributes to the magnetic resonance imaging coil;

storing a plurality of coil attributes associated with the magnetic resonance imaging coil in the memory device; and, disposing the memory device in a coil-side mating element.

9. The method of manufacturing as set forth in claim 8, wherein the disposing step comprises:

electrically connecting a ground pin from the memory device to a shield of a coaxial connector disposed in the coil-side mating element, a path to ground being selectively established via an associated shield of a coaxial connector in an MR-system-side mating element.

10. The method of manufacturing as set forth in claim 9, wherein the disposing step further comprises:

positioning a data pin from the memory element within a center element of a coil-side coaxial connector, a data path being selectively established via an associated data lead in the MR-system-side coaxial connector.

11. A method of manufactunng a magnetic resonance imaging coil comprising:

embedding a memory device in a magnetic resonance imaging coil assembly, the memory device capable of storing a plurality of coil attribute;

loading a coil name into a determined location in the memory device; and, loading representative currents and voltages for channels supported by the magnetic resonance imaging coil into determined locations in the memory device.

12. A magnetic resonance imaging coil for selective operable connection to a magnetic resonance scanner, the imaging coil comprising;

a radio frequency antenna for at least receiving RF signals;

a memory device for storing a plurality of attributes associated with the radio frequency antenna, the memory device located in a coil-side mating element having a plurality of connectors in signal communication with the radio frequency antenna and a coaxial connector connected with the memory device, the coil-side mating element being adapted for selective mechanical and data association with a corresponding mating element.

13. The magnetic resonance imaging coil as set forth in claim 12, wherein the memory device consists of an EEPROM.

14. The magnetic resonance imaging coil as set forth in claim 13, wherein the EEPROM is disposed within the coil-side mating element.

15. The magnetic resonance imaging coil as set forth in claim 13, wherein the EEPROM comprises exactly one data and power pin, and a ground pin.

16. The magnetic resonance imaging coil as set forth in claim 12, wherein the stored attributes comprise a coil name and representative currents and voltages for channels associated with the magnetic resonance imaging coil.

17. A magnetic resonance imaging coil comprising:

a localized coil including:
conductive windings forming a radio frequency coil,
a dielectric former supporting the conductive windings, and
a plug in data communication with the conductive windings;

and, a memory device located on the localized coil, the memory device storing attributes comprising representative modes, associated bias patterns and valid receive signal patterns associated with the magnetic resonance imaging coil.

* * * * *